United States Patent [19]

Kay

[11] Patent Number: 6,021,266

[45] Date of Patent: Feb. 1, 2000

[54] METHOD OF DESIGNING AN INTEGRATED CIRCUIT USING SCHEDULING AND ALLOCATION WITH PARALLELISM AND HANDSHAKING COMMUNICATION, AND AN INTEGRATED CIRCUIT DESIGNED BY SUCH METHOD

[75] Inventor: Andrew Kay, Oxford, United Kingdom

[73] Assignee: Sharp Kabushiki Kaisha, Osaka, Japan

[21] Appl. No.: 08/926,641

[22] Filed: Sep. 10, 1997

[30] Foreign Application Priority Data

Sep. 12, 1996 [GB] United Kingdom .................... 9619096

[51] Int. Cl.[7] .............................. G06F 17/50; G06F 15/60
[52] U.S. Cl. ................................ 395/500.03; 395/500.02; 395/705; 395/709
[58] Field of Search ...................................... 395/705, 702, 395/707, 708, 709; 375/372; 364/221.9, 237.7, 226.4, 226.7, 260.4, 262.4, 280

[56] References Cited

U.S. PATENT DOCUMENTS

| 5,005,136 | 4/1991 | Van Berkel et al. | 395/500.19 |
|---|---|---|---|
| 5,483,640 | 1/1996 | Isfeld et al. | 395/500.45 |
| 5,493,508 | 2/1996 | Dangelo et al. | 395/500.06 |
| 5,537,580 | 7/1996 | Giomi et al. | 395/500.2 |
| 5,557,531 | 9/1996 | Rostoker et al. | 395/500.02 |
| 5,598,344 | 1/1997 | Dangelo et al. | 395/500.19 |
| 5,603,043 | 2/1997 | Taylor et al. | 395/500.04 |
| 5,793,824 | 8/1998 | Burch et al. | 375/372 |
| 5,801,958 | 9/1998 | Dangelo et al. | 395/500.19 |
| 5,870,308 | 2/1999 | Dangelo et al. | 395/500.19 |

FOREIGN PATENT DOCUMENTS 0329233  8/1989  European Pat. Off. .

*Primary Examiner*—James P. Trammell
*Assistant Examiner*—Cuong H. Nguyen

[57] ABSTRACT

An integrated circuit is designed by defining its functions in a programming language which supports parallelism and synchronized communication. The resulting source code is supplied to a compiler which includes an optimizer module for retiming synchronized communication without changing the order of external communications of the integrated circuit. The compiler produces output code which represents the circuitry of the integrated circuit and which may be supplied to synthesis tools and subsequent steps in the manufacture of the integrated circuit.

13 Claims, 9 Drawing Sheets

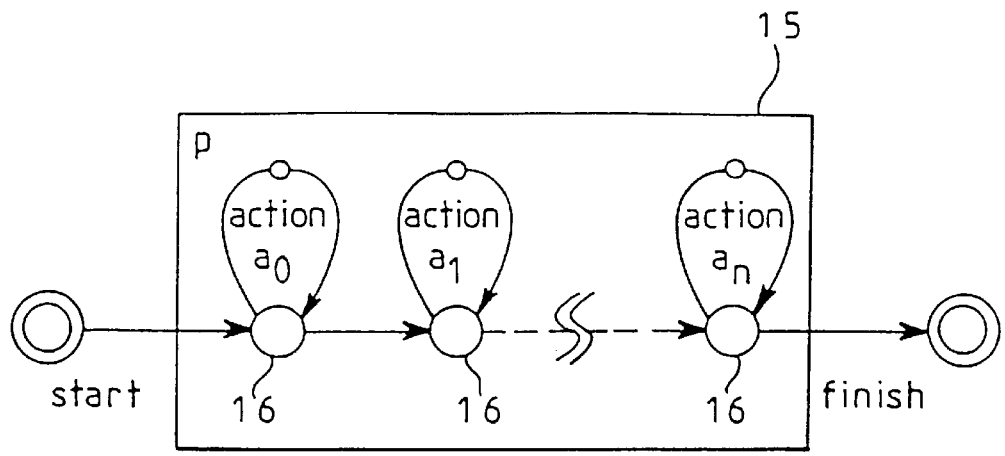
FIG 2A. process triggering
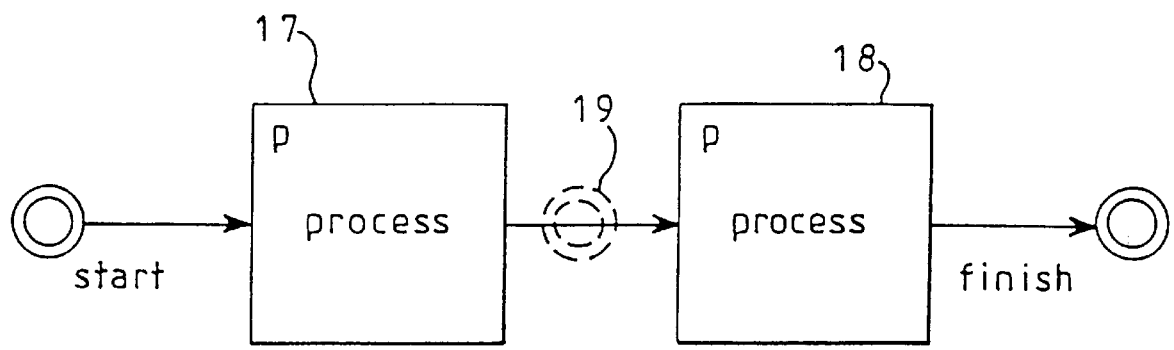
FIG 2B. sequential composition
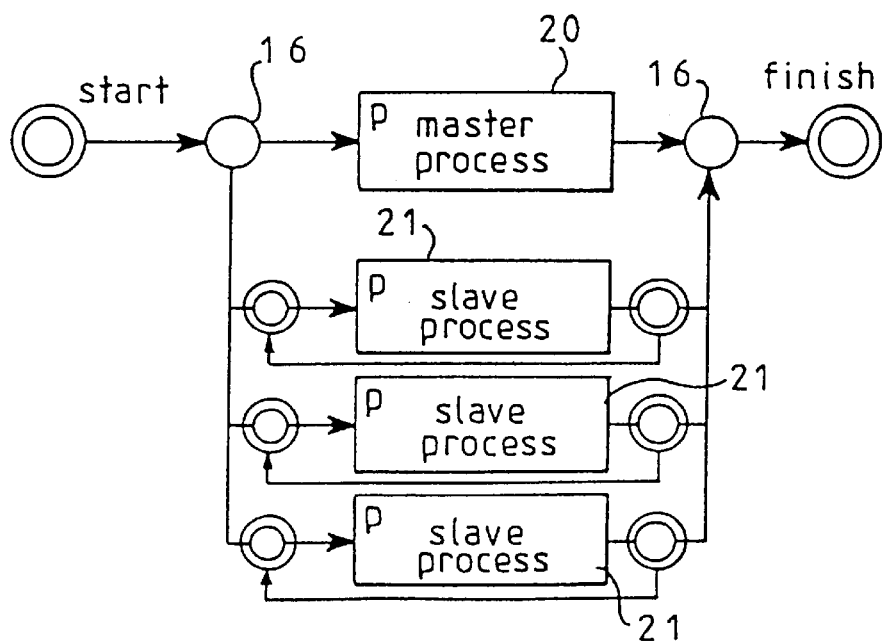
FIG 2C. parallel composition

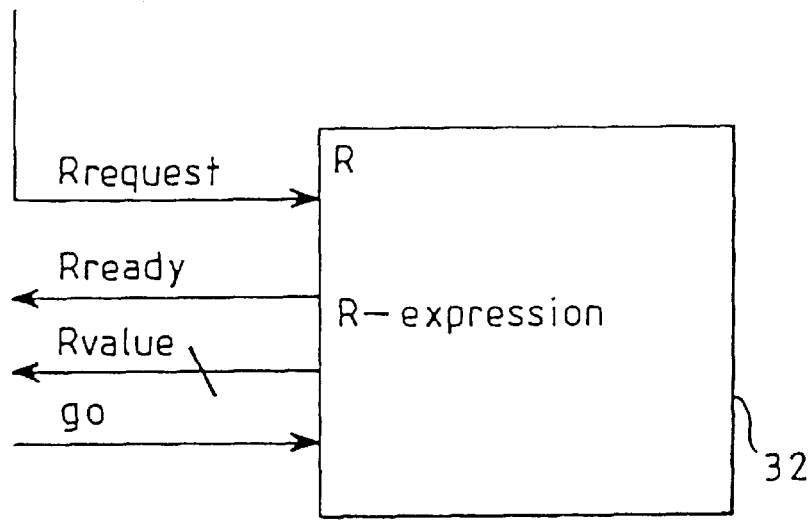
FIG 4A. R-expression interface
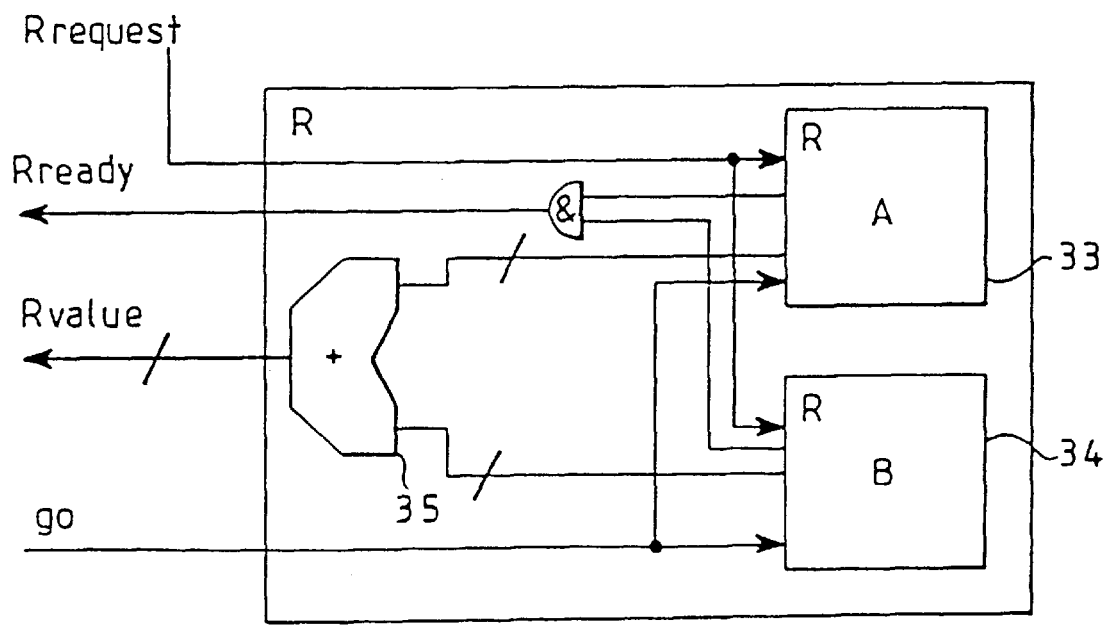
FIG 4B: construction of 'A + B'

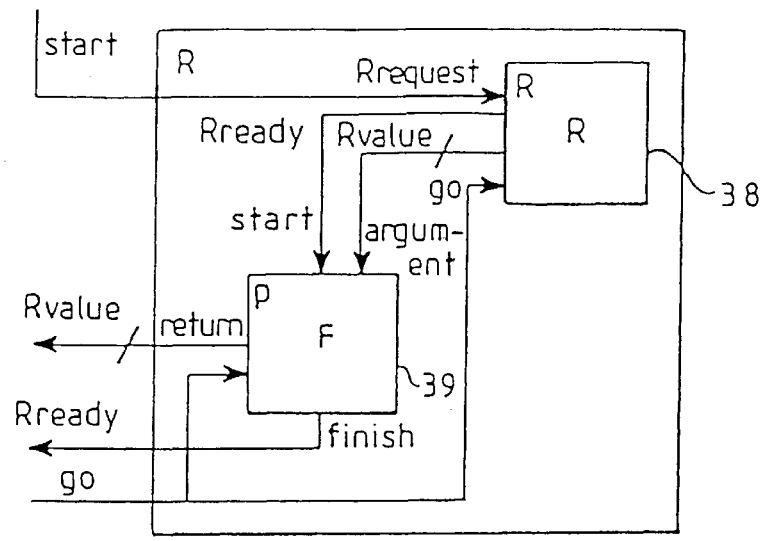
FIG 5A: function--call by value (f(R))
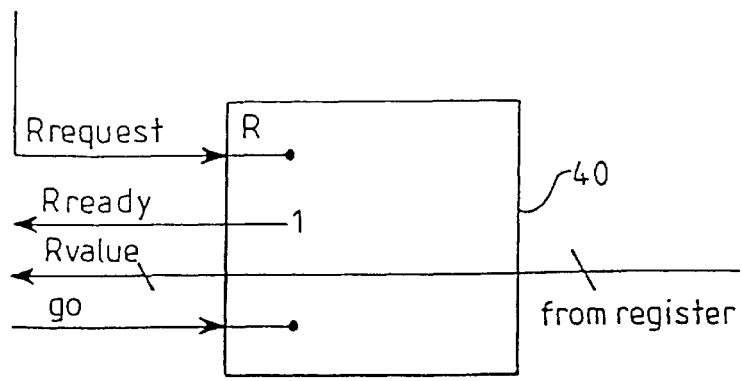
FIG 5B: R-expression interface to a simple variable
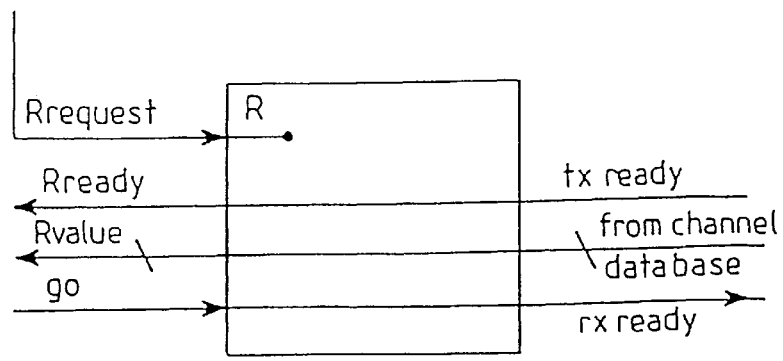
FIG 5C. R-expression interface to a channel

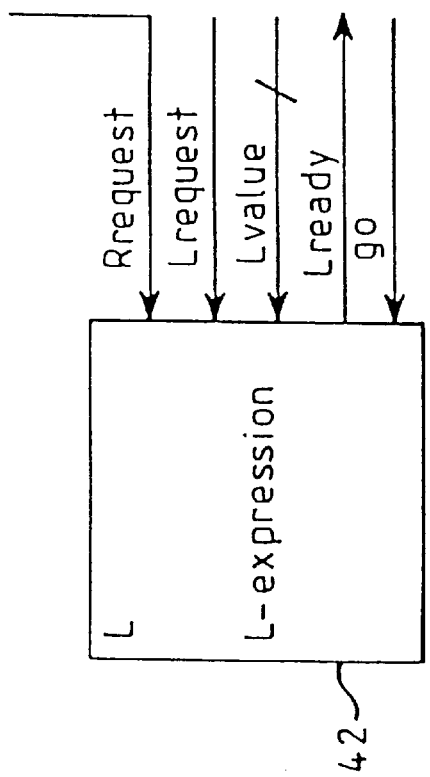
FIG 6A: L-expression interface
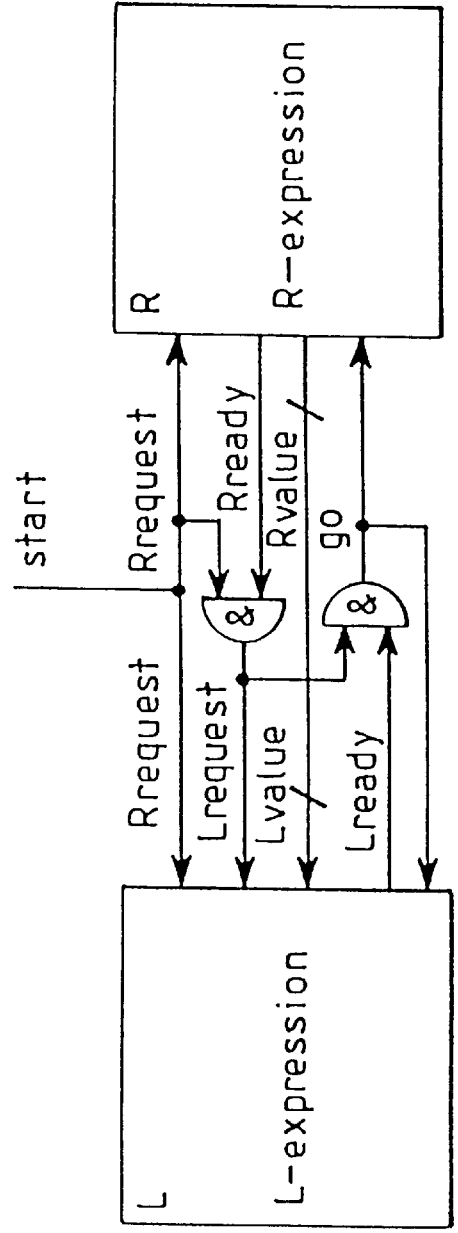
FIG 6B: assignment (L:=R)

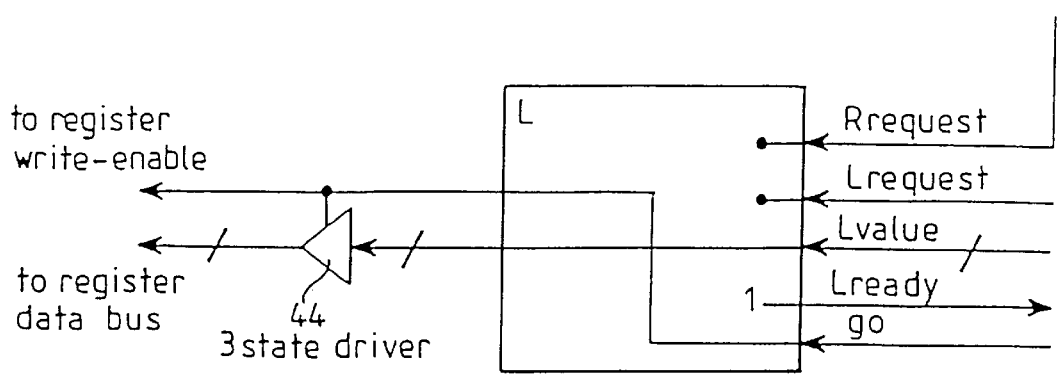
FIG 7A: L—expression for a simple variable
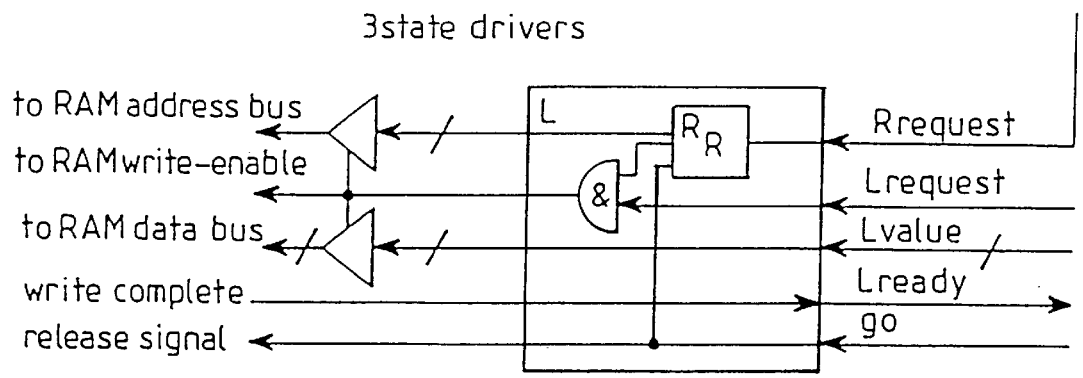
FIG 7B: L—expression for external memory write 'mem[R]'
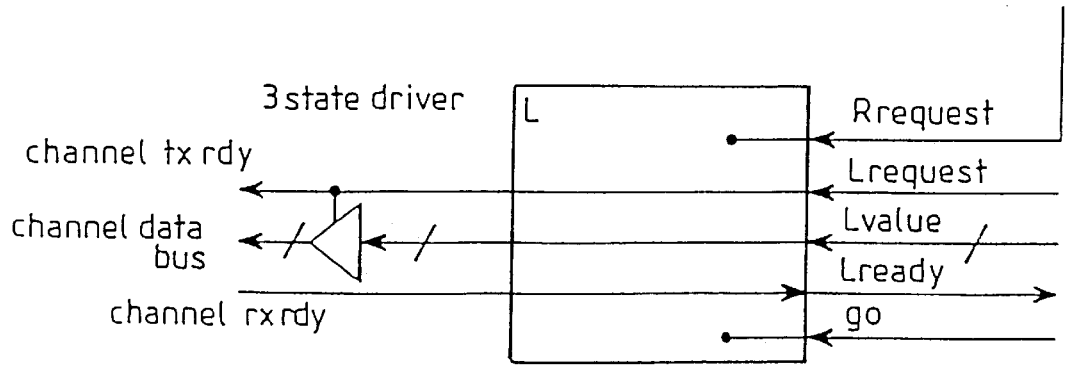
FIG 7C: L—expression for channel output combining expressions and control

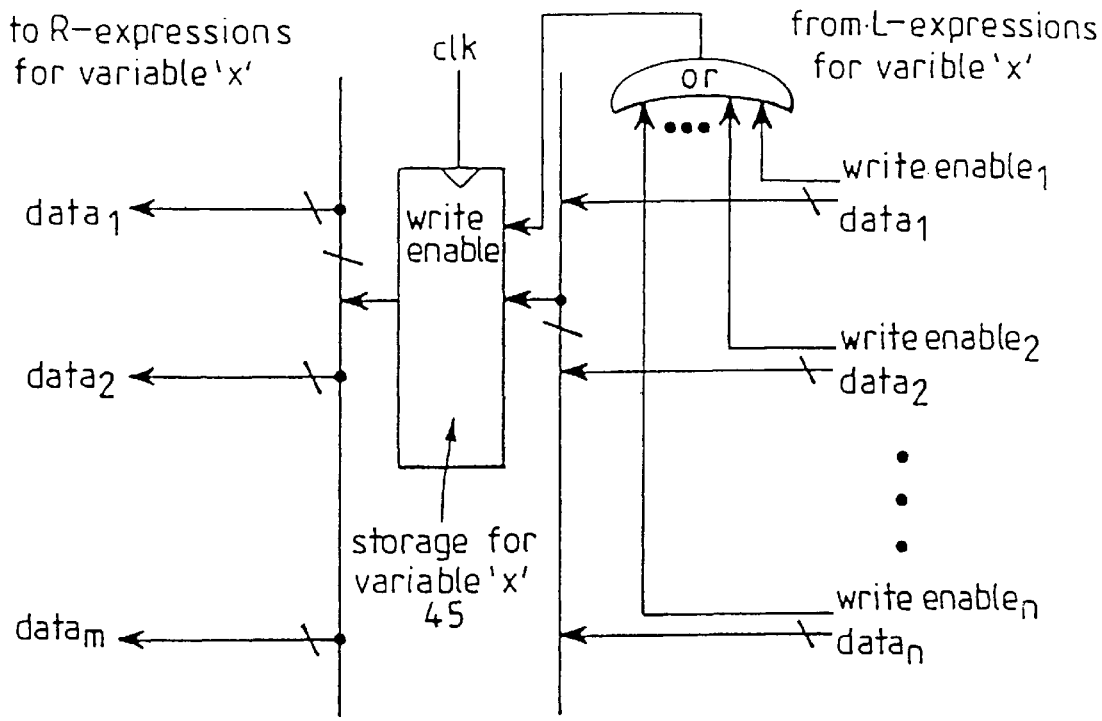
FIG 10 A: building a simple variable
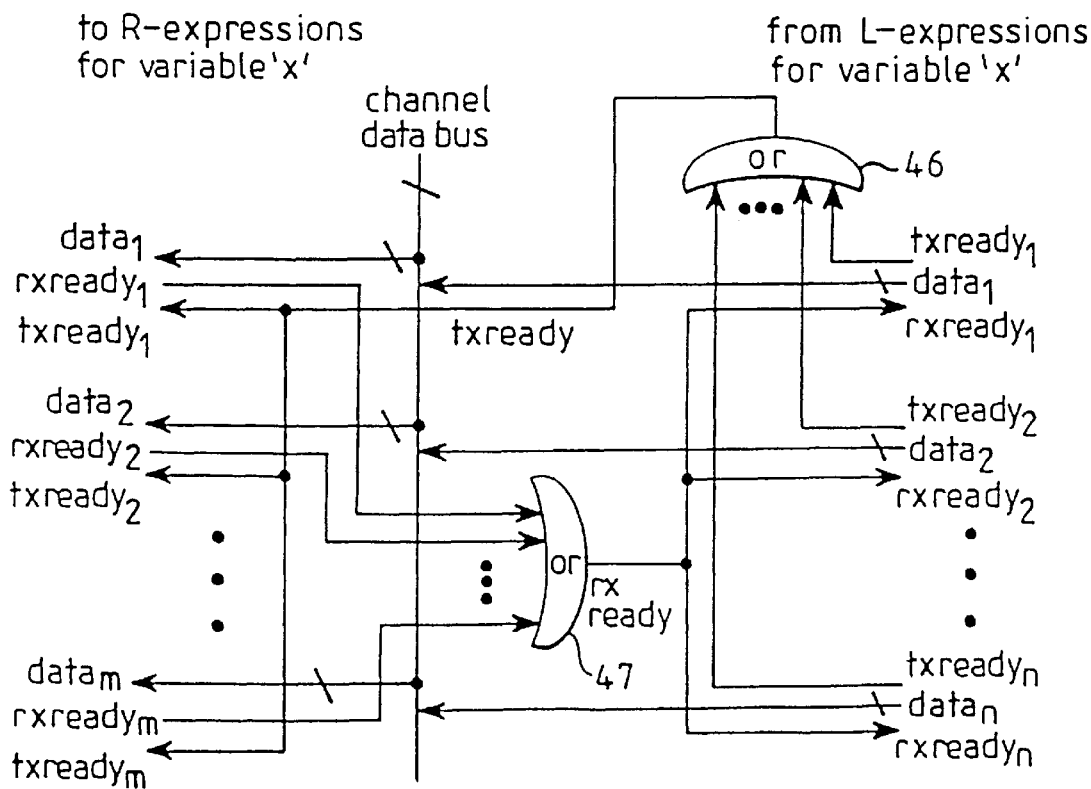
FIG 10 B: building a channel

METHOD OF DESIGNING AN INTEGRATED CIRCUIT USING SCHEDULING AND ALLOCATION WITH PARALLELISM AND HANDSHAKING COMMUNICATION, AND AN INTEGRATED CIRCUIT DESIGNED BY SUCH METHOD

TECHNICAL FIELD OF THE INVENTION

The present invention relates to a method of designing an integrated circuit. The invention also relates to an integrated circuit designed by such a method.

BACKGROUND OF THE INVENTION

A design for a large scale integrated (LSI) circuit comprises a collection of gates, for instance for performing binary functions such as AND, OR, NOT, FLIP-FLOP, together with a specification of how the gates are to be interconnected. A layout tool may then be used in convert the design into a form suitable for fabrication in an appropriate technology.

A known technique for producing such designs uses what is known as "schematic capture". According to this technique, a graphical software tool allows a user to place each logical gate or collection of gates from a library and to interconnect the gates by "drawing" the wiring with a computer mouse. The resulting circuit may then be optimised, for instance by removing or simplifying gates without changing the total function of the circuit, and submitted for layout and fabrication. However, a designer has to consider the timing and logic for every or almost every gate or collection of gates so that this technique is difficult to use for large designs and is prone to error.

In another known technique, the designer writes a description of the LSI circuit in a hardware description language (HDL). Each statement in the HDL corresponds to several gates in the final design so that the input source code is relatively short compared with the logical complexity of the final design. The productivity of the designer may therefore be increased. Known HDLs include VHDL disclosed in IEEE Standard VHDL Language Reference Manual, IEEE Std 1076–1993, IEEE, New York, 1993, and Verilog disclosed by D. E. Thomas and P. R. Moorby in the Verilog Hardware Description Language, Kluwer Academic 1995. Such languages may be used with an appropriate synthesis tool, such as that disclosed by S. Carlson in Introduction to HDL-Based Design Using VHDL, Snyopsys Inc., California, 1991 (Reference 1) so as to convert the design into circuitry.

When designing a new LSI circuit using such synthesis techniques involving HDLs, an algorithm for the behaviour of the circuit is captured by a software engineer in a suitable high level programming language such as that known as C. The algorithm is then tested for correct behaviour by means of a "test harness", for instance written in C. A test harness describes an environment in which the circuit design can be tested using a circuit simulator or emulator. A work station with a standard compiler is used to compile and run the test using sets of inputs, known as vectors, for the circuit stored on disc or in random access memory (RAM).

In the next step, a hardware engineer rewrites the C code in a language more suitable for hardware synthesis and simulation, such as VHDL Register Transfer Level (RTL) disclosed in Reference 1. At this point, there are many design choices to be made, such as what kind of architecture to use, should the data be pipelined, how will the circuit interface to the outside, and how many bits of storage should be allocated to each structure. Typically, the VHDL version is an order of magnitude larger than the original C version.

Because there is no direct link between the C version and the HDL version, it is likely that there will be errors in the HDL description so that testing at this stage is essential. Before the design can be tested, a new test harness must be written, for instance in VHDL. The harness is also likely to be an order of magnitude larger than the harness written in C. Once the VHDL version has been tested thoroughly, it can be converted into circuits using suitable synthesis tools as mentioned hereinbefore. However, the set of VHDL constructs which can be synthesised into circuits is relatively small compared to the size of the whole VHDL language. Also, most of the timing and architectural decisions must be explicitly annotated by the user, who must therefore have a very detailed knowledge about how each language construct will be synthesised. This knowledge will differ between different synthesis tools.

At this point, it is possible to discover that the synthesised circuit is too slow or too large for the intended design. It may then be possible to adjust the HDL to bring the design back inside its specified range. Otherwise, it may be necessary to try a new algorithm in C, which is costly in design time.

Progress has been made in raising the level of abstraction of HDLs so as to provide high level hardware design languages, for instance as disclosed by D. Gajski, N. Dutt, A. Wu and S. Lin in High-Level Synthesis, Introduction to Chip and System Design, Klewer, 1992. (Reference 2). An example of this is the synopsys Behavioral Compiler discloded in Synopsys On-Line documentation 3.2b (CDROM format), Synopsys Inc., California, 1995. The compiler receives source code in "behavoural" VHDL and produces lower level synthesisable VHDL as output. The input language is derived from a wider subset of the full VHDL language than the standard synthesisable subset. The compiler selects an architecture for the design and models it as a microprocessor core, ensuring that there is enough hardware available to meet the speed requirements of the whole circuit. The compiler may supply optimisations to trade off speed and area by means of scheduling and allocation style algorithms as disclosed in Reference 2.

The user must still provide timing information by annotating where clock edges are to occur and must know on which clock cycles input and output data must be available. For this reason, a substantial degree of hardware knowledge is required by a designer who attempts to use this system. Also, the resulting hardware description behaves differently from the original behavioral VHDL description, so that two different test harnesses may be required. Further, this system is not suitable for prototyping algorithms because of the necessary dependence on timing requirements, although these are now at the clock cycle level and not at the sub-clock level.

Other known compilers comprise Handel Compiler and Handel-C Compiler as disclosed by I. Page and W. Luck in Compiling Occam into FPGAs, 271–283, Abingdon EE & CS books, 1991. The Handel compiler receives source code written in a language known as Occam, for instance as disclosed in Inmos, The Occam 2 Programming Manual, Prentice-Hall International, 1988. Occam is a language similar to C but with extra constructs for expressing parallelism and synchronised point-to-point communication along named channels. The Handel-C compiler is almost identical but the source language is slightly different to make it more familiar to programmers who are familiar with C.

Because the compiler provides parallel constructs, the programmer is able to consider parallel algorithms as possible solutions to the design problem. Synchronised communication is achieved by a simple "handshake" technique of widely known type to ensure that no messages can be lost, whatever cycle the programmer initiates them. Thus, both the sender and receiver must wait for the communication to be completed before continuing. Because this constraint is enforced by the language, the result is increased freedom for the programmer to reschedule the communication events. For example, if the programmer requires the values 10 and 23 to be sent onchannels named c1 and c2, respectively, then, providing the receiving process is appropriately written, the data may be sent in either order, in parallel, or with an arbitrary delay before and between the send commands. An example of a pseudo code for this is as follows:

seq[send(c1,10);send(c2,23);]
OR seq[send(c2,23);send(c1,10);]
OR par[send(c1,10);send(c2,23);]
OR seq[delay(x);send(c1,10);delay(y);send(c2,23);]

The handshake protocol (however it is implemented) ensures that the items of data are received when the receiver is ready and that none are lost. In this way there is some freedom over exactly when two parts of the compiled circuit interact.

However, in Handel, the programmer takes total control of the timing of each construct (other than communication). Each construct is assigned an exact number of cycles (this is called a timed semantics) and so the programmer must take into account all the low-level parallelism in the design and must know how the compiler assigns each construct to a clock cycle. The programmer can, for example, specify:

a:=b*c+d*e but, since all assignments take just one cycle, this requires both multiplicaitons to happen in a single cycle. This implies that two multipliers must be built which is expensive in area, and they must operate in a single cycle, leading to low clock speed.

In addition there are several important constructs that Handel cannot cope with, mainly due to the timed semantics. These include: assignments referring to an array (RAM) twice because this would imply an expensive dual port RAM; expressions involving function calls; and functions with parameters.

SUMMARY OF THE INVENTION

According to a first aspect of the invention, there is provided a method of designing an integrated circuit comprising defining the functions of the integrated circuit in a programming language supporting parallelism and synchronised communication, and applying a compiler which is arranged to retime synchronised communications without changing the order of external communications of the integrated circuit so as to produce output code representing circuitry of the integrated circuit.

The synchronised communicaiton may comprise handshaking.

The compiler may be arranged to form an abstract syntax tree and a symbol table. The compiler may include a software optimiser for simplifying the abstract syntax tree. The software optimiser may be arranged to convert compound data structures to component parts such that there is one variable for each component part. The software optimiser may be arranged to removed unused variables. The software optimiser may be arranged to move common operators outside loops.

The compiler may include a hardward optimiser for optimising the hardware implementation representing the output code. The hardware optimiser may be arranged to perform scheduling and allocation.

The compiler may be arranged to terminate optimisation when at least one predetermined performance parameter has been achieved. At least one predetermined performance parameter may comprise a maximum integrated circuit area. At least one predetermined parameter may comprise a minimum integrated circuit processing speed. At least one predetermined parameter may comprise a maximum power consumption.

The method may comprise generating register transfer level code representing circuitry for performing constructs defined by the output code.

According to a second aspect of the invention, there is provided an integrated circuit designed by a method according to the first aspect of the invention.

Preferred embodiments of the invention are defined in the other appended claims.

The use of a communication protocol such as handshaking together with high-level optimisation permits the designer more freedom to express communication in an abstract way because the compiler can produce an efficient implementation. The input language may be high level and familiar to programmers and may support most of the important constructs which have a sensible representation in hardware. The language can express parallelism and point-to-point communication but does not have a timed semantics. The compiler can perform optimisation at a relatively high level, for instance close to source code level, and can output an HDL so that low level synthesis, optimisation and hardware mapping can be performed by industry-standard tools. the functionality of a design in a C-like software language with parallel constructs and point-to-point communication can be translated automatically or semi-automatically into HDL for efficient LSI design. The use of an untimed source language semantics allows the compiler to make optimisations which improve the timing of the design while following the original source language specification.

Known languages which use timed source language semantics are bound to honour the timings implicit in the original source code so that the compiler may not perform optimisations which change the number of cycles taken by the program and it is the user's responsibility to encode timing behaviour in the original source code. There is therefore a design-time penalty in using times semantics, in which the designer must perform his or her own optimisations and the compiler is not allowed to help.

BRIEF DESCRIPTION OF THE DRAWINGS

The invention will be further described, by way of example, with reference to the accompanying drawings, in which:

FIG. 2 illustrates diagrammatically how a control path is synthesised by the compiler of FIG. 1, wherein FIG. 2A illustrates a single process with a start and finish time, FIG. 2B illustrates how two processes are made to execute sequentially, and FIG. 2C illustrates how several processes are made to execute concurrently;

FIG. 4 illustrates how expressions are encoded, wherein FIG. 4A illustrates a single R-expression interface and FIG.

Figure 8:
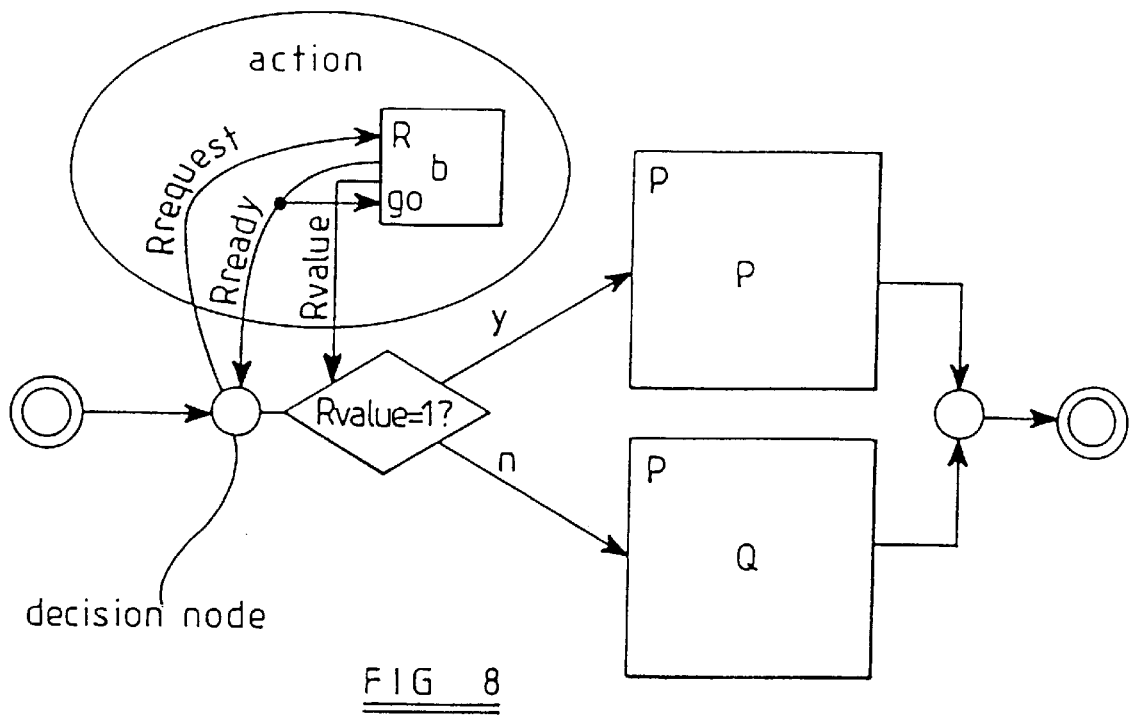
Figure 9:
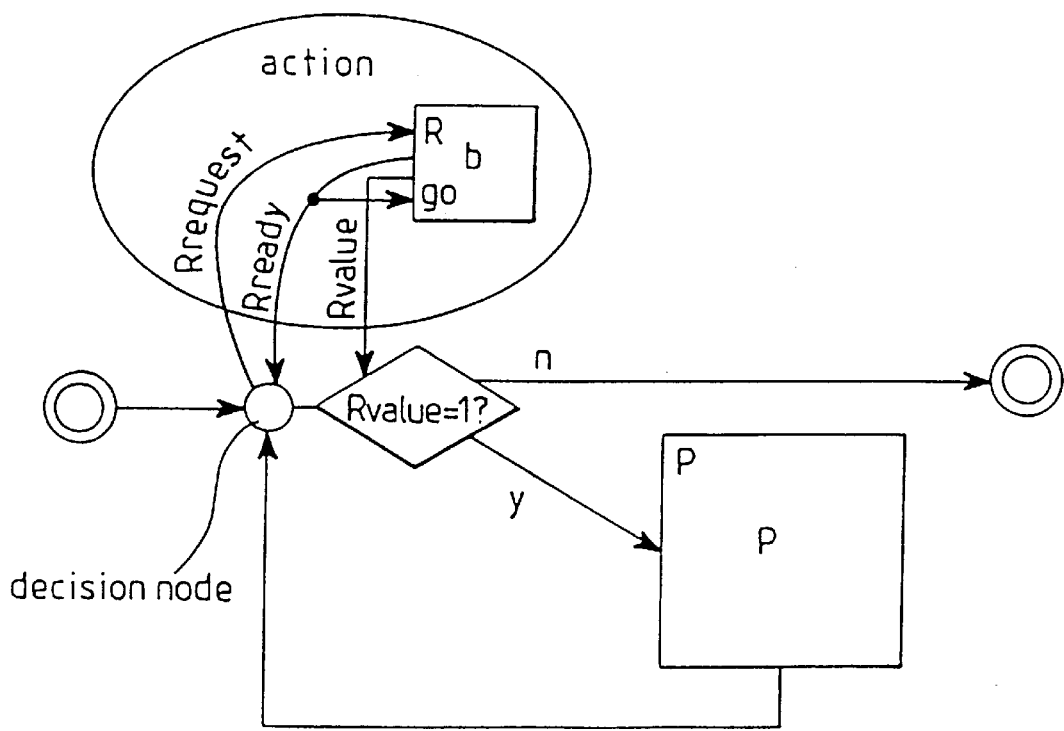

4B illustrates how an expression A+B is built from expressions for A and B;

FIG. 5A illustrates how a call-by-value function call is made;

FIG. 5B illustrates how a simple variable is read;

FIG. 5C illustrates how a channel is read;

FIG. 6 illustrates how L-expressions are encoded, wherein FIG. 6A illustrates a single L-expression interface and FIG. 6B illustrates how an L-expression and an R-expression are combined to create an assignment;

FIG. 7 illustrates how some specific L-expressions are encoded, wherein FIG. 7A illustrates how a write to a simple variable or register is managed, FIG. 7B illustrates how a write to an external memory is managed, and FIG. 7C illustrates how channel output is managed;

FIG. 8 illustrates how to build a conditional statement;

FIG. 9 illustrates how to build a loop statement; and

FIG. 10 illustrates how to build resources, wherein FIG. 10A illustrates how to build a simple variable and FIG. 10B illustrates how to build a channel.

DETAILED DESCRIPTION OF THE INVENTION

Figure 1:
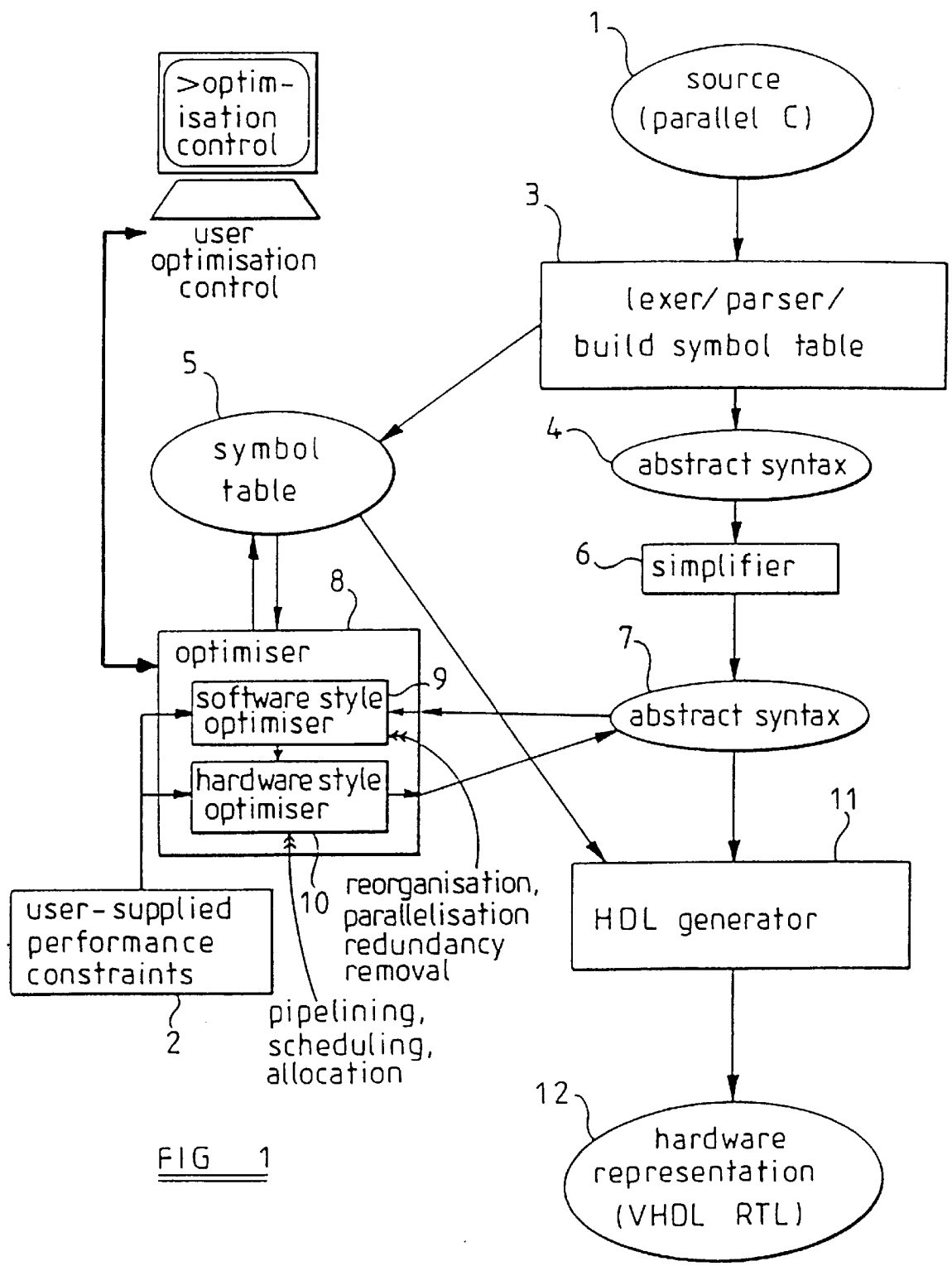
FIG. 1 is a schematic diagram illustrating the structure of a hardware compiler forming part of an embodiment of the invention.

The compiler shown in FIG. 1 receives source code 1 written in the high level language known as "parallel C". This language includes constructs and handshaking point-to-point communication primitives and specifies user-supplied performance constraints (indicated at 2), for instance relating to the cost and performance of the final design. The compiler comprises module 3 which parses and checks the input soruce code to create an intermediate abstract syntax tree (AST) representation at 4 and a symbol table 5 which keeps track of names and objects declared in the source code. Suitable lexers and parsers are disclosed by A. V. Aho and J. D. Ullman in Principles of Compiler Design, Addison-Wesley, 1977 (Reference 3) at pages 197 to 244. The intermediate syntax has representations for sequential, parallel and loop structures as well as specific annotations which can be used to represent scheduling and allocation of operations.

The AST is supplied to a simplifier module 6 which rewrites any awkward constructs in terms of simpler ones. In particular, the output from the simplifier module 6 uses only a subset of the full abstract syntax to allow the following stages to be coded more simply. For instance, the simplifier module 6 resolves compound data structures into component parts with one variable for each component.

The simplified AST 7 is supplied to an optimiser module 8 comprising a software optimiser module 9 followed by a hardware optimiser module 10. The software optimiser module 9 optimises the simplified AST 7 using techniques from software optimisation, for instance as disclosed in Reference 3 at pages 406 to 517 and such as removal of unused variables and moving of common operations outside loops. Because communication is performed using a protocol such as handshaking, data cannot be lost in transit. Communications may therefore be moved around in the simplified AST such that, although the final timing in the design may be affected, the temporal ordering of such communications is not changed. Because the source code 1 is written in a language which allows parallelism, the software optimiser module 9 may introduce measures such as pipelining of calculations in order to meet the performance constraints 2.

In order to ensure that all optimisations contribute to a better design, an estimation function is used. Estimation functions may be used to estimate gate count, circuit area, circuit speed, latency, throughput, power consumption, resource requirements, etc. When software optimisation is complete, the hardware optimiser module 10 performs optimisations which are specific to hardware targets. Suitable hardware optimisers are disclosed in Reference 2 at pages 137 to 296. Because circuit area and number of gates is an important consideration in hardware generation, these optimisations are designed to ensure that hardware can be reused wherever possible, taking timing into account. The process includes techniques for pipelining, scheduling and allocation and each optimisation is again subjected to an estimation function to ensure that an improvement has been achieved. The result of optimisation by the module 10 adds extra information to the symbol table 5 about the optimal hardware representation of each variable and operator. For example, an initialised array which is never written to can be represented by a read only memory (ROM), which is cheaper than a RAM required for read/write arrays.

Optimisation by the modules 9 and 10 may be terminated when the estimation functions indicate that the design meets the performance and cost constraints 2 specified by the user. If it is not possible to meet these constraints, a message may be supplied to the user. In addition, there may be user-interaction to direct the optimiser module 8 by selecting particular optimisaitons or providing parameters for optimisation. The optimisations do not affect the functionality of design in an appropriate environment but may achieve different performance or cost.

The optimised AST and the modified symbol table are supplied to an HDL generator module 11, which traverses the AST and builds a hardware representation for each construct using the information collected in the symbol table 5. The generator module 11 thus supplies a hardware representation 12 in a suitable language such as VHDL RTL. Industry standard tools may then be used to convert the RTL into an LSI circuit.

Three examples of the types of optimisation which the module 8 is capable of performing will now be described.

EXAMPLE 1

This example shows one way in which a software-style optimisation can improve algorithm performance. Consider the following code:

```
a := 3
b := 1
while (true)
    b := b + (a * a)
    send (ch, b)
```

These are several possible optimisations which could apply here. First a*a is calculated on every loop iteration and the answer is always the same because a does not change inside the loop. It could be replaced by a single calculation before the loop begins and an assignment to a temporary variable. In hardware, this corresponds to freeing the multiplier for use elsewhere while the loop is executing and also possible to speeding up the loop latency if the multiplier requires more than one cycle. This can only be done because the send command is timing independent:

```
a := 3
b := 1
tmp := a*a
while (true)
    b := b + tmp
    send (ch, b)
```

The second optimisation is to observe that a=3, tmp=9. Therefore the program can be rewritten as:

```
a := 3
b := 1
while (true)
    b :- b + 9
    send (ch, b)
```

Now a is never read from, so it can be removed altogether:

```
b :- 1
while (true)
    b := b + 9
    send (ch, b)
```

EXAMPLE 2

For an example of hardware-style optimisation, consider again the assignment:

a=b*c+d*e

The timed semantics of known compilers, as mentioned earlier, insists that this statement in the source language must be executed in a single clock cycle in the implementation. This leaves little choice but to build two flash multipliers and an adder. The effect of this is to produce a large area for the two multipliers and for the cycle time to be slow (flash multipliers typically have high combinaitonal delay, depending on the widths of the inputs).

However, there is no such restriction in the compiler of FIG. 1. The multiplies could be sequentialised:

a:=b*c
a:=a+d*e

Next the multiples could be assigned to a shared multiply function:

a:=sys_mult(b,c)
a:=a+sys_mult(d,e)

The multiplier could be tailored to fit the job at hand—a fast (but large) parallel multiply, or a sequential multiply requiring several cycles (but very small, and the clock speed can be higher). In either case, a single multiplier is sufficient. The actual choice can be made automatically or by the user with guidance from the compiler.

EXAMPLE 3

This example shows how an assignment can be rescheduled to improve the efficiency of the final design.

Consider the example program a=b*c;
c=x*y;
send (output, a);
b=a+d;

If we have a single multiplier and a single adder, then the whole program can be compressed into two cycles, provided the receiver is ready to receive the value of a, as follows:

a=b*c;
par
{
c=x*y;
send (output, a);
b=a+d
}

Known compilers cannot reschedule the communication in this way, so they cannot make this optimisation. For instance, a compiler with timed semantics cannot change the timing of the source language whereas a compiler such as Behavioral Compiler cannot optimise across boundaries imposed by communication.

The source code 1 for a design is written in parallel C, a subset of C with some additions. These additions are as follows:

a construct, par, for parallel processes. The par construct may be used anywhere within a program, so that parallelism may be introduced at any granularity from system level down to the single statement level. The syntax extends the usual C statement syntax:

statement=. . .
| par {[statement]*}

For example, to run two function calls in parallel:

```
par{
    func1(x, y);
    func2(x + y, z);
}
``` synchronised channels with given types. These allow communication between branches of a par, and also between the synthesised circuit and its environment (when used with the usual extern keyword of C).

Internal channels are declared using the following extension to the syntax of declarations:

declaration-. . .
| [storage_class] chan [type]identifier[,identifier]*;

For example, the following declares two internal channels a and b which communicate using data of the structure type comm:

chan struct comm a, b;

Channels are undirectional so, for communication with the environment, it is necessary to know whether the process has the sending or the receiving end of any shared channel. The keywords chanin and chanout make this distinction, and must be used in all external channel declarations:

declaration=. . .
| [storage_class] chanin [type] identifier [identifier]*;
| [storage_class] chanout [type] identifier [,identifier]*;

For example, to declare channels from_env and to_env which communicate with the environment in 16 bit integers:

extern chanin int from_env;
extern chanout int to_env;

primitives send (chan,val) and receive (chan). The former sends the value val down the channel chan. The latter receives a value from channel chan and may be used to build expressions. Each channel communicates data in a point-to-point fashion and each of the two communicating processes must wait for the communication to be completed before continuing. In addition, there is a function ready (chan) which is true when there is data waiting to be sent on channel chan.

statement=. . .
| send (identifier, expression);
expression=. . .
| received (identifier)
| ready (identifier)

The following example shows a pair of processes, one of which generates integers and sends them to the other (using the channel ch) which totals them.

```
chan int ch;
par {
    {
        inti = 0;
        while (1)
            send (ch, i++);
    }
    {
        int tot - 0;
        while (1)
            tot += receive(ch);
    }
}
``` a set of integer types of given bit widths, to allow efficient circuits to be built to whatever numeric accuracy is required. For this we extend the set of type modifiers to include #e, where e is a constant expression, denoting a width equal to the value of e:

type_modifier=. . .
| #constant_expression

For example, to declare a channel called c of type 'unsigned 7 bit integer' use:

chan unsigned#7 c;

a bit selection and bit concatenation operators for constructing efficient circuits for bit manipulation. The @ symbol is used for concatenation. The 'grab' operator (written <—) takes an expression, e, and a list of constant bit-positions, $b_1 \ldots b_n$. When it is evaluated, it returns an n bit result, $e_{b1} \ldots e_{bn}$, where $e_i$ is the ith bit of e.

expression− ... | expression@ expression

| expression < _{constant_expression[, constant_expression]*

For example, in 3-bit binary $5_{10}=101_2$, $7_{10}=111_2$. So in 6-bit binary $5_{10}@7_{10}=101111_2=47_{10}$. To select the top four bits from $47_{10}$, the expression $47_{10}$<—{5,4,3,2} yields the value $1011_2=11_{10}$.

The standard C part of the input language has all the control features, such as if, while, switch, blocks, functions, and most of the arithmetic and data manipulation, excluding pointers. Pointers may, however, be imitated using indexes into arrays. Arrays are realised as specialised logic within the synthesised circuit, except for "extern arrays" which are assumed to be RAM or ROM components outside the circuit.

The semantics of the C parts of the language are similar to the semantics of C, that is, expressions, assignment, if, while, for, break and so on. The semantics for par and channel communication are similar to the semantics for Occam, as disclosed in the INMOS reference hereinbefore, and CSP disclosed by C. A. R. Hoare in Communication Sequential Processes, International Series in Computer Science, Prentice-Hall, 1985. There are usage rules similar to those in Occam. Where the same variable is accessed from two different parallel components, the behaviour is undefined unless all the accesses are read-only.

As described hereinbefore, after the source code is entered into a file, the compiler begins at 3 by parsing it using standard parsing technology into an abstract syntax tree 4 which records the structure of the design and the substructure and so on, and building a symbol table which records the types of names of all identifiers used. The symbol table links the various conversion stages together by collating information about each identifier as the processing progresses.

The next step is to simplify at 6 the abstract syntax tree. The reason for this is that not all programming features can be translated into hardware by the generator 11. The simplifier module 6 removes those unsupported constructs and replaces them with equivalent constructions which are supported by the HDL generator module 11. For example, the generator module does not allow assignments to have side effects, as in a=(b++)+5 in standard C. The simplified equivalent might look more like a=b+5; b=b+1. In addition the simplifier module 6 calculates the widths and types of all the operators and constants and stores this information in the syntax tree.

Send(ch,R) is simplified into what looks like an assignment: ch:=R. The representation 'knows' it is really a channel send because of the type of ch in the symbol table. However, the uniformity of this notation (destinations are always written to the left of an assignment, whatever protocol is required) allows later transformations to be described with fewer special cases. In a similar way X:=receive(ch) is simplified into the assignment x:−ch.

The design is now expressed as a combination of a simplified abstract syntax 7 and a symbol table 5. It is necessary to remove any constructs which are not handled by the HDL generator, and to perform optimisations. For example, access to external arrays (RAM) will assume a single port RAM unless there is information to the contrary. So an expression such as mem[i]:=mem[j] would not be treated correctly by the HDL generator, as it generates two accesses to the memory at (almost) the same time. This could be rewritten as local t; t:=mem[j]; mem[i]:=t.

One possible standard optimisation is to remove calculations from loops if they do not need to be repeated. For example:

While (x<10)
x: =x 1 (y*y)
. . . could be rewritten as . . .
declare tmp
tmp: −y y
While (x<10)
x: =x+tmp Another possibility is to share registers between variables whose lifetimes do not overlap. For example:

```
Sequence:
Declare tmp1
        tmp1 := f(x)
        send(ch,tmp1)
Declare tmp2
        tmp2 := g(y)
        send(ch,tmp2)
```

... could be rewritten as
Sequence:
Declare tmp
tmp: =f(x)
send(ch,tmp)
tmp: =g(y)
send(ch,tmp)

If the optimiser module 10 finds a structure used in only certain special ways, it can record this information in the syntax tree (or in the symbol table) so that the generator module 11 can use it to produce tighter code. For example, if an array is initialised with constants and never updated, it can be implemented as cheap ROM rather than more expensive RAM.

One important construct in the abstract syntax is a form of assignment synchronisation. This allows several assignments to be performed simultaneously to save time or storage space or both. For example, instead of local tmp; tmp:=a; a:=b; b:=tmp; it is possible to optimise this to synch {a:=b AND b:=a}. Assignments handle all communication of values for registers, channels and arrays. This construction then allows several useful actions to be condensed into a shorter time than would otherwise be possible. There are limits to what can be synchronised and this depends on the particular implementation.

The optimiser module 10 is allowed to do more drastic things such as making sequential code operate in parallel or vice versa, removing a channel and replacing it with a weaker form of synchronisation, expanding a function in-line, sharing a multiplier by turning multiplication into a call to a shared multiply function, sharing duplicate sections of code or expressions, pipelining complex expressions provided that the external behaviour of the resulting circuit is unchanged. Of course, the speed, area and number of cycles may vary but, since all external interfaces have handshakes, this does not matter provided that the ordering of communications is preserved.

The optimisations may be applied automatically or may be user-directed or user-selected. The goal is to reach the specified area, power or time bounds dictated by the particular application. These attributes may be estimated by simple metrics applied to the abstract representation.

The HDL generator module 11 takes the refined abstract syntax tree and converts it into a circuit description in the HDL. By this stage, every construct left in the abstract syntax has a well specified implementation in hardware, some of which are described hereinafter. The general technique differs from known techniques in important ways:

Assignments can be more complex, and may involve channel communication and parameterised function calls. This requires a more complex protocol between parts of expressions so that, for example, a multiplier knows when its arguments are ready.

Since the compiler produces HDL rather than a netlist, it may leave some choices, in particular the method for implementing state machines and registers, down to the synthesis tools lower in the design chain.

The basic scheme is that a control path is synthesised as a state machine from the control statements in the abstract syntax. In most states, some computation is to occur. The state machine initialises the computation and waits for it to complete before moving on to the next state. In the case of an IF, for example, the location of the next state depends on the value computed. Parallelism is handled by allowing one state machine to trigger a set of other state machines which then run concurrently.

Because each computation may take an unknown time to complete, for instance if it sends or receives from a channel or external device, performs a data dependent calculation, or performs a function call, the circuit performing the computation must be able to signal its completion and wait until its value has been used before disasserting it. This explains the complexity of the protocol for expressions described hereinafter. A simpler protocol could be used provided that the optimisation step simplified the abstract syntax sufficiently, but in some cases this could lead to longer execution times. In addition, any post-synthesis gate-level optimisation will remove the extra levels of signalling where it is not required.

FIG. 2 shows how the basic building blocks for the control path are created. The stages follow the shape dictated by the abstract syntax tree. In FIG. 2A, a state machine 15 representing a process is shown. The large circles 16 are the control nodes and each one may relate to an action or set of actions. In the simplest case, these are assignments or communications corresponding to the basic processes in the abstract syntax language. The state machine 15 can only step to the next state when its action is complete.

In FIG. 2B, sequential composition is shown as the sequential composition of the component state machines 17 and 18 with the finish state 19 of the first machine coalesced with the start state of the second machine.

In FIG. 2C, parallel composition is shown. One master process 20 is special and is inserted into the current sequential state machine in the usual way. All the other slave processes 21 wait for the master process to start before starting themselves.

At the end of the parallel section, the master process 20 waits for all the slave processes 21 to finish before continuing itself. Each slave process 21 then returns to its initial wait state ready for another activation. While they are running, the master and slave processes have the same status; it is only the method of starting that distinguishes them.

Figure 3:
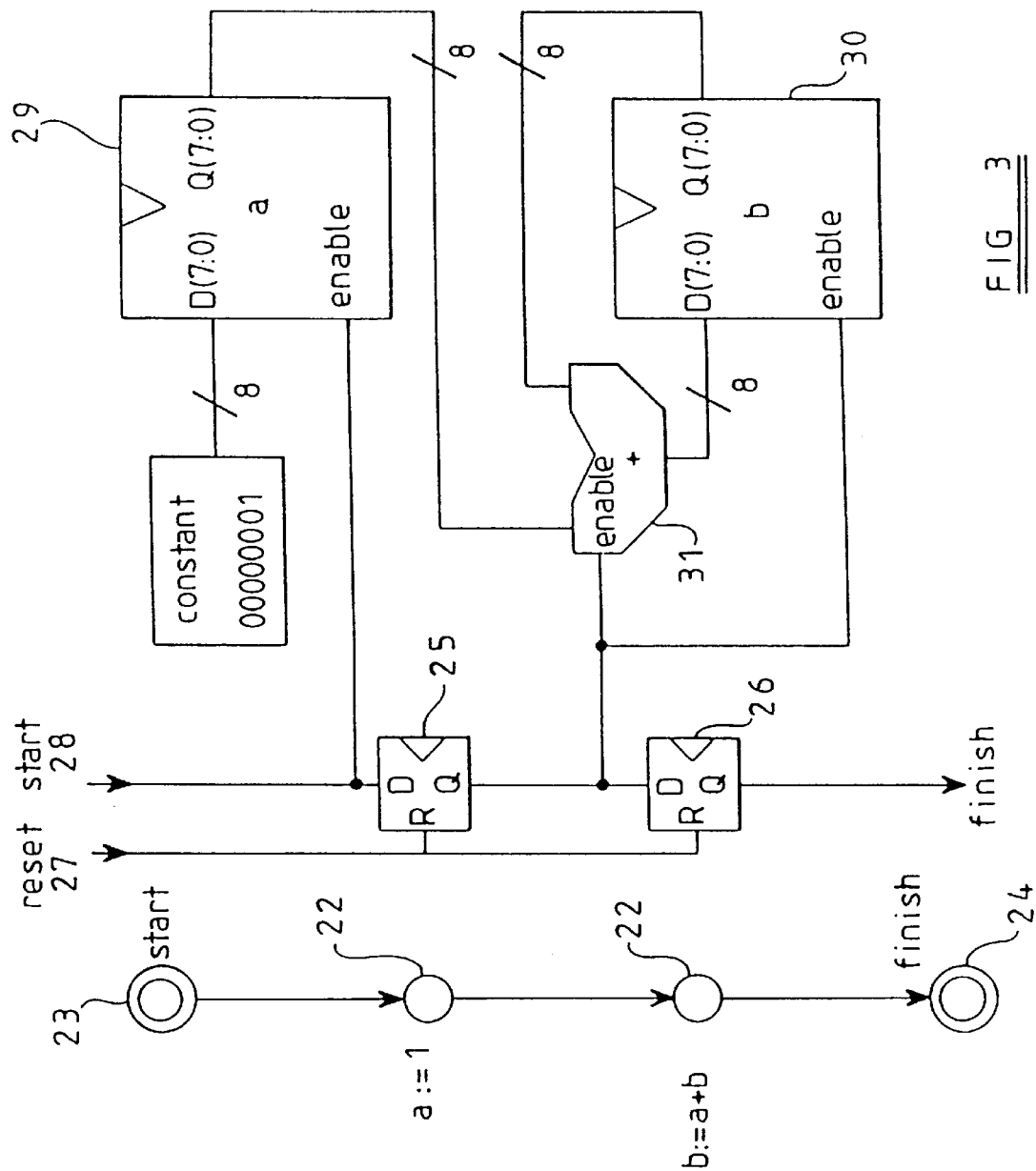
FIG. 3 illustrates a possible circuit for a simple example program.

Consider the following fragment of abstract syntax, assuming that a and b have been declared with width 8:
Define 1D1("a")
Define 1D2("b")
a:−1
b:−a+b FIG. 3 shows a possible circuit which could be generated for this program. On the left hand side of FIG. 3 is the abstract state machine for the example. There are two internal states 22, one for each of the assignments, as well as the usual start and finish states 23 and 24. The rest of FIG. 3 shows a possible circuit. The flip-flops 25, 26, 29, 30 are connected to a global clock (not shown), and trigger on the rising edge.

The resettable D-type flip-flops 25, 26 represent the state machine in a "one-hot" encoding. This means that each flip-flop stands for one possible state. A state is active when its flip-flop contains a 1, and is inactive otherwise. A reset line 27 is necessary to set the flip-flops 25, 26 to 0 before the program begins. Other codings can be used to represent the state machine, but this is perhaps the simplest.

The start pulse 28 travels down the chain at a rate of one state per clock cycle. This is a special case, because it is assumed that the assignments take just one cycle each. In a more complicated example, some circuitry must be generated to make the pulse wait until the relevant action is complete.

In the first internal state, the enable bit of the register 29 for variable a is set true, and this allows the constant value 1 in 8 bits (00000001 in binary) to be stored at the next rising clock edge.

In the second internal state, the enable bit of b's register 30 is set true, as is the enable bit for a single cycle adder 31. Thus the previous values for a and b are stored in b when the next rising clock edge occurs.

FIG. 4A shows how R-expressions 32, i.e. expressions whose values are required as data, are interfaced. When the value of an R-expression is required, the signal Rrequest is asserted. This must be held true until the value is no longer required. The expression then calculates a value, outputs it as the signal Rvalue, and asserts the signal Ready to show it is valid. When Rvalue is no longer required the input signal go is true for a single clock cycle and Rrequest goes false. Rvalue and Rready may be disasserted until the next time Rrequest is true. Of course, for many simple expressions such as constants and combinational expressions, much of the apparent complexity of this scheme can be easily simplified by a gate level optimiser during synthesis.

In FIG. 4B, an R-expression for A+B is constructed from the R-expressions 33, 34 for A and B together with an adder 35 and some combinational logic. R-expressions can be constants, simple variables, array references, channel inputs or reads from external memories, as well as the usual arithmetic, logical and bitwise combinations. The Rrequest and go signals are broadcast to both components 33, 34 and their Rvalues are fed into the adder 35 which is assumed in this case to be a combinational adder. The Boolean AND of the Rready signals is taken as Rready for the compound. This circuit is sufficient to implement any combinational expression, simply by changing the adder 35 for whatever function is required. If the operation to be performed is not combinational, then the operator itself must supply the Rready by combining the two component Rreadys in an appropriate way. Such a connection could also be used for power saving, where the adder 35 is switched off until the input data is valid.

A single adder (or other operator) may be shared between several calculations simply by inserting multiplexers between the operands and the operator input and a demultiplexer on the operator output. It is essential for the optimiser module 8 to ensure that there can be no conflict, for example if two calculations attempt to use the same operator at once (this is called scheduling and allocation).

FIG. 5 shows some other R-expressions. FIG. 5A shows how a call by value function may be called. The actual parameters (arguments) are concatenated together to give the single expression R 38. When this expression is ready, it fires up the process which implements the function F 39 in a way similar to the slave processes in FIG. 4. This diagram does not show the arbitration necessary for F to ensure that it is not activated more than once at a time; this simple logic is built inside F. Any return value from F is passed to the caller on the Rvalue signal, and Rready is asserted when F terminates. The go signal is broadcast to both F and R.

FIG. 5B shows how a simple variable is implemented. The value itself is stored in a register (not shown) and the output from the register is available to each R-expression that required it, through the Rvalue signal. Rrequest and go are ignored. Since the value is always available, Rready is tied to logic 1.

FIG. 5C shows how to read from a channel. The expression is ready when the channel's txready signal is true. The final part of the handshake is the go signal. The go signals from all the R-expressions which read from a particular channel are ORed together to create the rxready (ready to receive) signal for that channel.

FIG. 6 shows how L-expressions (expressions denoting destinations for values) are formed. FIG. 6A shows the standard interface for an L-expression 42. L-expressions may be simple variables, array references, channel outputs, external memory writes or combinations of these. The Rrequest signal is used to start any embedded R-expressions (usually array index calculations) within the L-expression. The Lrequest signal starts the L-expression proper, and is set true when there is valid data on the Lvalue signal. When the storage operation is ready to complete, the LRready signal is raised. Finally, when the environment of the expression is ready, the go signal is set true for one cycle to indicate release of resources. In a combination of L-expressions, only one L-expression is permitted to require more than a single clock cycle and this subexpression determines the timing for the whole operation. All the other subexpressions must have LRready always true. If this condition is not met, then the protocol can fail.

In FIG. 6B the interface is used to show how an assignment is constructed.

FIG. 7 shows how some specific L-expressions are encoded. FIG. 7A shows how a write to a simple variable (register) is managed. The write data is put onto the write bus for that variable via a three state driver 44 which is enabled when the go is sent. For this to work, it is assumed that the write takes a single cycle. The write enable signal for the register is taken to be the logical OR of all the write-enable signals for all the L-expressions which write to that register. It is up to the optimisation stage to ensure that there will be no conflicts.

FIG. 7B shows how a write to an external memory is managed. The write-complete signal must be held true until the go signal arrives. Again, all the write-enables pertaining to this memory device must be ORed together.

FIG. 7C shows how channel output is managed. All the L-expressions for channel outputs for a given channel are collected together. The txready (ready to transmit) for the channel is the OR of all the partial txready signals (one for each L-expression which mentions this channel). The individual rxready signals are connected directly to the channel rxready.

FIG. 8 shows an implementation of if b then P else Q. The ready signal from the R-expression b is directed through a multiplexer which is controlled by the value returned by b. This selects whether the state machine should continue with P or with Q.

FIG. 9 shows an implementation of while C(b) do P. The state machine is directed by the value of b either to execute P again, or to continue without.

FIG. 10 shows how to build resources. Each variable, array, channel or function is a resource. After the HDL generator module 11 has traversed the syntax tree, each resource will have been accessed by one or more various R-expressions and L-expressions. For each resource, the HDL generator module 11 must build an appropriate circuit to define the correct behaviour of a resource using the signals from the 'back-end' of those R-expressions and L-expressions.

FIG. 10A shows how to build a simple variable, implemented as an edge triggered register 45 with write-enable.

The data buses (containing values to be written) from the L-expressions are joined and the write-enable signals are ORed together. Outputs (R-expressions) are easier; the data is merely copied to where it is needed.

FIG. 10B shows how to build a channel. All the L-expressions (channel outputs) have their data buses joined together and these are copied to the data buses of all the R-expressions (channel inputs) for this channel. It is assumed that there are m points at which the channel is read from and n points to which the channel is written. The writers' txready signals are ORed 46 and broadcast to the readers. Similarly the readers' rxready signals are ORed 47 and broadcast to the writers.

EXAMPLE

Consider the following example fragment:

```
void main( )

{ unsigned #8 x;

for (x = O; x < 1O; x++)
    {
        x<< =1;
    }
}
```

This is a very artificial example, because there is neither input nor output. However, it is short and easy to understand. The variable X starts with the value 0. Then it is incremented and shifted one bit left, and this step is repeated until it is not less than 10. The program then terminates. The output has been tidied up a little to make it more readable.

The symbol table has the following entries:

```
        ID1 FUNCTION main void → void
                    ID2 VARIABLE x    Int#8
The abstract syntax looks like:
Define ID1("main")
    Declare ID2("x")
        FOR (x = O(#8); x < 1O(#8); x++)
            x < < = 1;
```

There is no "for" construct in the HDL generator, and assignments with side effects must have their side effects made explicit, so this simplifies into:

```
Define ID1("main")
    Declare ID2("x")
    x := 0(#8)
    While (x < 10(#8))
        x := x < < 1
        x := x + 1(#8)
```

The optimiser module spots that the two assignments inside the loop can be combined:

```
Define ID1("main")
    Declare ID2("x")
    x := 0(#8)
    While (x < 10(#8))
        x := (x < < 1) + 1(#8)
```

Finally the HDL generator module produces the following output in VHDL RTL for synthesis. First there is the entity declaration, which describes the interface to the environment:

```
library ieee;
use Ieee.std_logic_1 164. all;
use ieee.std_logic_arith. all;
use work.bach_std.all;
entity main is
        port(
                cik : in std_logic;
                reset : in std_logic;
                start : in std_logic;
                finish : out std_logic
                );
    end main;
```

Second there is the architecture which describes the behaviour of the entity. This is divided into three parts: some local declarations; the state machine for the control path; and the register definition for storage and data paths:

Local declarations:

architecture RTL of main is

```
type sm_main_O_type is (state_main_O_O, state_main_O_1,
        state_main_O_3,state_main_O_4);
signal sm_main_O : sm_main_O_type;
signal var_x3 : unsigned (7 downto 0);
signal varw_x3 : unsigned (7 downto 0);
begin
```

```
main_0; process (clk)
begin
    if ((clk'event and clk='1')) then
        if ((reset = '1')) then
            sm_main 0<=state_main_0_0;
        else
            case (sm_main_0) is
                when stat_main_0_0 =>
                    if ((start = '1')) then
                        sm_main_0<- state_main_0_1;
                    end if;
                when state_main_0_1 =>
                    sm_main_0<=state_main_0_3;
                when state_main_0_3 =>
                    if ((var_x3>=unsigned '("00001010"))) then
                        sm_main_0<=state_main_0_0;
                    elseif ((var_x3<unsigned'("00001010"))) then
                        sm_main_0<=state_main_0_4;
                    end if;
                when state_main_0_4=>
                    sm_main_0<=state_main_0_3;
            end case;
        end if;
    end if;
    end process;
```

```
        var_x3<-varw_x3;
        proc_var_x3: process (clk)
        begin
            if ((clk'event and clk='1')) then
                if ((reset = '1')) then
                    varw_x3< =conv_unsigned(0,8);
                else
                    if ((sm_main_0=state_main_0_4)) then
                        varw_x3< =conv_unsigned(((var_x3 * 2) +
                                     unsigned '("00000001")), 8);
                    elseif ((sm_main_0 = state_main_0_1)) then
                        varw_x3< =conv_unsigned(unsigned '("00000000"), 8);
                    end if;
                end if;
            end if;
        end process;
        finish< =bool2bit((sm_main_0=state_main_0_0));
    end RTL;
```

As described above, in accordance with the present invention, upon designing an integrated circuit, a software algorithm concerning the functions and/or the specifications of the integrated circuit to be designed, which is described in a C-like software language, is translated (in other words, compiled) automatically or semi-automatically into a hardware description language (HDL) using an appropriate compiler which performs optimization at a high level. As a software language for describing the software algorithm, a high level language which can describe parallelism and synchronized communication, such as a parallel C, can be employed.

Thus, according to the present invention, upon designing an integrated circuit, a time period required for the translation from the software level described in the high level language into the hardware level is shortened, resulting in an improved efficiency in hardware development.

What is claimed is:

1. A method of designing an integrated circuit comprising the steps of:
    defining functions of the integrated circuit in a programming language which supports parallelism and synchronized communication; and
    applying a compiler which is arranged to retime the synchronized communication without changing the order of external communication of the integrated circuit so as to produce output code which represents circuitry of the integrated circuit,
    wherein the compiler includes a hardware optimizer for optimizing hardware implementation which is represented by the output code, and the hardware optimizer is arranged to perform scheduling and allocation.

2. A method according to claim 1, wherein the synchronized communication comprises handshaking.

3. A method according to claim 1, wherein the compiler is arranged to form an abstract syntax tree and a symbol table.

4. A method according to claim 3, wherein the compiler includes a software optimizer for simplifying the abstract syntax tree.

5. A method according to claim 4, wherein the software optimizer is arranged to convert compound data structures to component parts such that there is one variable for each of the component parts.

6. A method according to claim 4, wherein the software optimizer is arranged to remove unused variables.

7. A method according to claim 4, wherein the software optimizer is arranged to move common operators outside loops.

8. A method according to claim 4, wherein the compiler is arranged to terminate optimization when at least one predetermined performance parameter has been achieved.

9. A method according to claim 1, further comprising the step of generating register transfer level code which represents circuitry for performing constructs defined by the output code.

10. An integrated circuit which is designed by the method according to claim 1.

11. A method of designing an integrated circuit comprising the steps of:
    defining functions of the integrated circuit in a programming language which supports parallelism and synchronized communication; and
    applying a compiler which is arranged to retime the synchronized communication without changing the order of external communication of the integrated circuit so as to produce output code which represents circuitry of the integrated circuit,
    wherein the compiler is arranged to form an abstract syntax tree and a symbol table, the compiler includes a software optimizer for simplifying the abstract syntax tree, and the compiler is arranged to terminate optimization when at least one predetermined performance parameter has been achieved, and
    wherein the at least one predetermined performance parameter comprises a maximum integrated circuit area.

12. A method of designing an integrated circuit comprising the steps of:
    defining functions of the integrated circuit in a programming language which supports parallelism and synchronized communication; and
    applying a compiler which is arranged to retime the synchronized communication without changing the order of external communication of the integrated circuit so as to produce output code which represents circuitry of the integrated circuit,
    wherein the compiler is arranged to form an abstract syntax tree and a symbol table, the compiler includes a software optimizer for simplifying the abstract syntax tree, and the compiler is arranged to terminate optimization when at least one predetermined performance parameter has been achieved, and
    wherein the at least one predetermined performance parameter comprises a minimum integrated circuit processing speed.

13. A method of designing an integrated circuit comprising the steps of:
    defining functions of the integrated circuit in a programming language which supports parallelism and synchronized communication; and
    applying a compiler which is arranged to retime the synchronized communication without changing the order of external communication of the integrated circuit so as to produce output code which represents circuitry of the integrated circuit,
    wherein the compiler is arranged to form an abstract syntax tree and a symbol table, the compiler includes a software optimizer for simplifying the abstract syntax tree, and the compiler is arranged to terminate optimization when at least one predetermined performance parameter has been achieved, and
    wherein the at least one predetermined performance parameter comprises a maximum power consumption.

* * * * *